United States Patent
Yeh

(10) Patent No.: US 7,292,834 B2
(45) Date of Patent: Nov. 6, 2007

(54) SWITCHABLE HIGH FREQUENCY BANDPASS FILTER

(75) Inventor: Ming-shuan Yeh, Taoyuan (TW)

(73) Assignee: Delta Electronics, Inc. (TW)

( * ) Notice: Subject to any disclaimer, the term of this patent is extended or adjusted under 35 U.S.C. 154(b) by 330 days.

(21) Appl. No.: 10/646,029

(22) Filed: Aug. 22, 2003

(65) Prior Publication Data

US 2004/0214549 A1   Oct. 28, 2004

(30) Foreign Application Priority Data

Apr. 22, 2003  (TW) ............................. 92109425 A

(51) Int. Cl.
*H04B 1/16* (2006.01)
(52) U.S. Cl. .................. 455/307; 455/339; 455/552.1
(58) Field of Classification Search ................ 455/339, 455/340, 307, 127.4, 552.1
See application file for complete search history.

(56) References Cited

U.S. PATENT DOCUMENTS 4,736,457 A * 4/1988 Kupfer .................. 455/188.1
6,064,866 A * 5/2000 Lange .................... 455/180.1
6,208,875 B1 * 3/2001 Damgaard et al. ........ 455/552.1
6,895,228 B2 * 5/2005 Satoh ...................... 455/168.1
6,937,845 B2 * 8/2005 Watanabe et al. ............ 455/83

* cited by examiner

*Primary Examiner*—Edward F. Urban
*Assistant Examiner*—Adeel Haroon
(74) *Attorney, Agent, or Firm*—Martine Penilla & Gencarella, LLP

(57) ABSTRACT

A switchable high frequency bandpass filter includes an input node and an output node, a switchable LC resonator, and a switch signal input interface circuit. The switchable LC resonator is coupled between the input node and the output node for providing a plurality of high frequency signals having different frequencies with a plurality of switchable filter transfer functions. The switch signal input interface circuit is coupled to the switchable LC resonator. A switch signal is supplied to the switchable LC resonator through the switch signal input interface circuit for controlling the switchable LC resonator to provide the plurality of high frequency signals having different frequencies with a suitable one of the plurality of switchable filter transfer functions, respectively.

18 Claims, 4 Drawing Sheets

SWITCHABLE HIGH FREQUENCY BANDPASS FILTER

BACKGROUND OF THE INVENTION

1. Field of the Invention

The present invention relates to a high frequency bandpass filter and, more particularly, to a switchable high frequency bandpass filter, in the field of high frequency communication technology, for providing two high frequency signals having different frequencies with different filter transfer functions, respectively.

2. Description of the Related Art

In today's high frequency communication technology, multi-frequency communication electronic products such as dual-frequency or triple-frequency mobile phones have been developed in order to enlarge an available range of frequency for communication. Typically, it is necessary for multi-frequency communication electronic products to design suitable component circuits in accordance with each of the multiple operational frequencies, thereby satisfying specific requirements of individual operational frequency. As a result, the multi-frequency communication electronic products require a large number of component circuits, not only preventing reduction of size but also increasing production cost.

To reduce the size of the multi-frequency communication electronic products, it is intended that the same component circuits can be commonly employed for multiple operational frequencies so as to minimize the number of necessary component circuits. However, each component circuit has its own distinct high frequency characteristic and therefore cannot be applied to multiple operational frequencies. In other words, if multiple signals with different operational frequencies are commonly processed by the same component circuits, some harmful interference problems may result between the operational frequencies.

For example, a high frequency bandpass filter is generally employed in a high frequency communication system to perform a function of frequency selection. In the multi-frequency communication electronic products, in order to provide each of operational frequencies with an optimum function of frequency selection, it is necessary for every operational frequency to design a dedicated high frequency bandpass filter, thereby providing high frequency signals having different frequencies with different filter transfer functions. However, as described above, such a manner does not only prevent the reduction of size of the multi-frequency communication electronic products but also increases the production cost.

SUMMARY OF THE INVENTION

In view of the above-mentioned problems, an object of the present invention is to provide a switchable high frequency bandpass filter capable of providing two different high frequency signals with two different filter transfer functions in order to enhance frequency selecting ability, thereby reducing interference between signals.

Another object of the present invention is to provide a switchable high frequency bandpass filter capable of providing two different high frequency signals with two different filter transfer functions in order to minimize the number of necessary component circuits.

According to one aspect of the present invention, a switchable high frequency bandpass filter includes: an input node and an output node, a switchable LC resonator, and a switch signal input interface circuit. The switchable LC resonator is coupled between the input node and the output node for providing a plurality of switchable filter transfer functions for a plurality of high frequency signals having different frequencies transmitted from the input node to the output node. The switch signal input interface circuit is coupled to the switchable LC resonator. A switch signal is applied to the switchable LC resonator through the switch signal input interface circuit for controlling the switchable LC resonator to provide the plurality of high frequency signals having different frequencies with a suitable one of the plurality of switchable filter transfer functions, respectively.

Preferably, the switchable LC resonator includes: an inductive unit, a first capacitive unit, and a second capacitive unit. The inductive unit is coupled between the input node and ground. The first capacitive unit is coupled between the input node and ground such that the inductive unit and the first capacitive unit construct a first-state parallel LC resonant circuit. The second capacitive unit is coupled between the input node and ground such that the inductive unit, the first capacitive unit, and the second capacitive unit construct a second-state parallel LC resonant circuit.

Preferably, the switch signal is a DC voltage signal having a predetermined lower voltage level and a predetermined higher voltage level. The second capacitive unit is enabled when the switch signal is at the predetermined lower voltage level. The second capacitive unit is disabled when the switch signal is at the predetermined higher voltage level. Accordingly, the switchable LC resonator switches in configuration between the first-state parallel LC resonant circuit and the second-state parallel LC resonant circuit.

BRIEF DESCRIPTION OF THE DRAWINGS

The above-mentioned and other objects, features, and advantages of the present invention will become apparent with reference to the following descriptions and accompanying drawings, wherein.

DETAILED DESCRIPTION OF THE PREFERRED EMBODIMENTS

The preferred embodiments according to the present invention will be described in detail with reference to the drawings.

Figure 1:
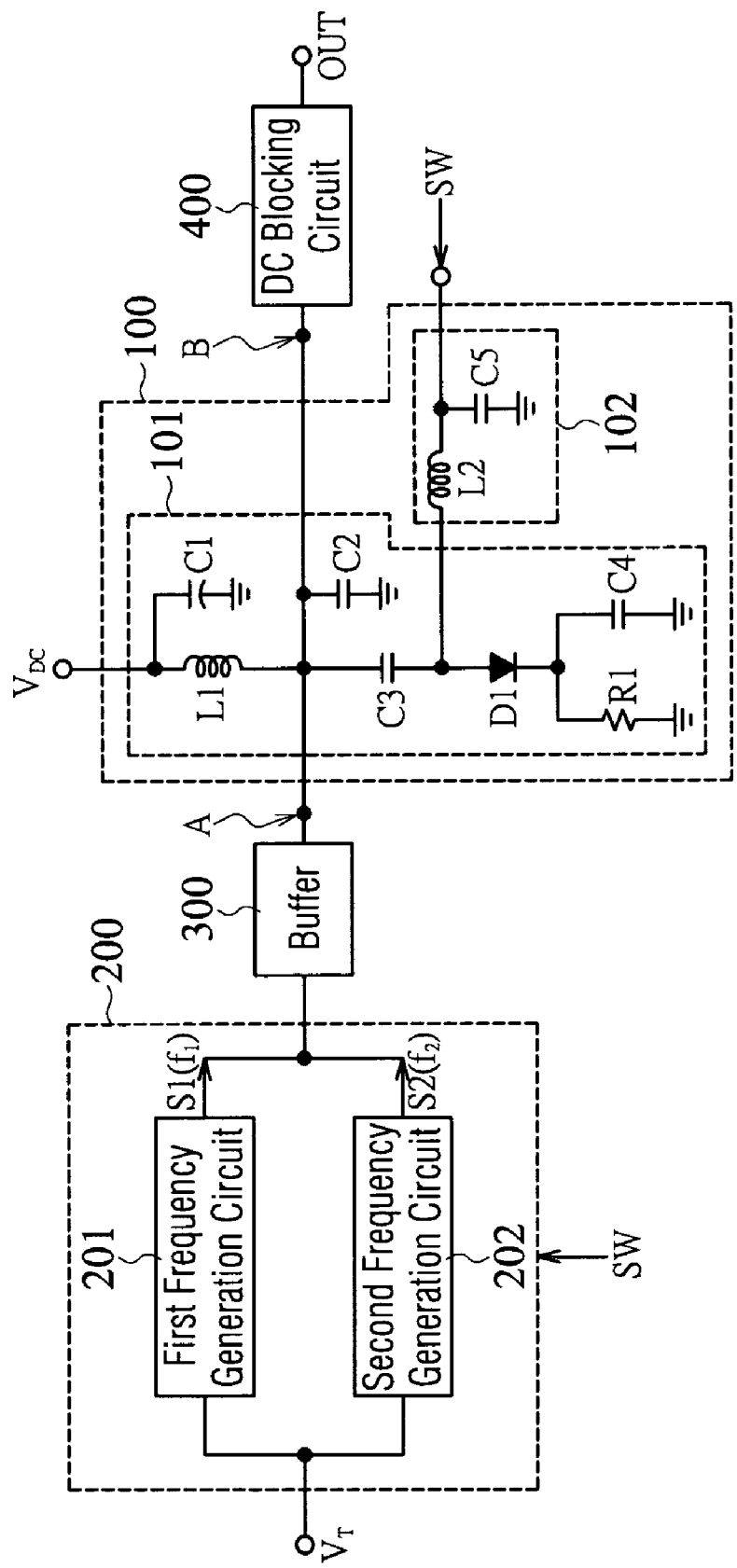
FIG. 1 is a schematic diagram showing a switchable high frequency bandpass filter according to the present invention.

FIG. 1 is a schematic diagram showing a switchable high frequency bandpass filter 100 according to the present invention. Referring to FIG. 1, the switchable high frequency bandpass filter 100 has an input node denoted by a reference numeral A and an output node denoted by a reference numeral B. The input node A of the switchable high frequency bandpass filter 100 receives two high frequency signals of different frequencies output by a high frequency signal generator 200. For example, the high frequency signal generator 200 may be constructed by a first frequency generation circuit 201 and a second frequency generation circuit 202. The first frequency generation circuit 201 generates a first high frequency signal S1 having a first frequency $f_1$ whereas the second frequency generation circuit 202 generates a second high frequency signal S2 having a second frequency $f_2$. In an embodiment of the present invention, the second frequency $f_2$ of the second high frequency signal S2 is substantially twice as high as the first frequency $f_1$ of the first high frequency signal S1. One skilled in the art should understand that the switchable high frequency bandpass filter 100 according to the present invention is not limited to the embodiment described herein, but may be applied to any possible frequency relationships between the first high frequency signal S1 and the second high frequency signal S2.

For example, the first frequency generation circuit 201 and the second frequency generation circuit 202 may be formed by different voltage control oscillators. Therefore, the desired first high frequency signal S1 and the desired second high frequency signal S2 are generated by supplying a suitable tuning voltage $V_T$ into the first frequency generation circuit 201 and the second frequency generation circuit 202. In addition, the high frequency signal generator 200 may be controlled by a switch signal SW so as to determine which one of the first and second frequency generation circuits 201 and 202 is enabled and which one is disabled (inhibited), thereby determining whether the first high frequency signal S1 or the second high frequency signal S2 is output from the high frequency signal generator 200.

As shown in FIG. 1, in an embodiment of the present invention, the first and second high frequency signals S1 and S2 may be coupled to the input node A of the switchable high frequency bandpass filter 100 through a buffer 300. On the other hand, the output node B of the switchable high frequency bandpass filter 100 outputs the first and second high frequency signals which have been subjected to the filter transfer functions. These signals from the output node B of the switchable high frequency bandpass filter 100 may be coupled to a common high frequency output terminal OUT through a DC blocking circuit 400. For example, the DC blocking circuit 400 may be a capacitive element (not shown), one terminal of which is coupled to the output node B of the switchable high frequency bandpass filter 100 and another terminal is coupled to the common high frequency output terminal OUT. In this case, the DC blocking circuit 400 constructed by the capacitive element effectively blocks DC signals and, at the same time, passes through high frequency signals.

Referring to FIG. 1, the switchable high frequency bandpass filter 100 includes a switchable LC resonator 101 coupled between the input node A and the output node B and a switch signal input interface circuit 102 coupled to the switchable LC resonator 101. The switchable LC resonator 101 provides switchable filter transfer functions for the first and second high frequency signals S1 and S2 transmitted from the input node A to the output node B. Through the switch signal input interface circuit 102, the switch signal SW for controlling the high frequency signal generator 200 is also applied to control the switchable LC resonator 101, thereby ensuring the provision of suitable filter transfer functions for the first and second high frequency signals S1 and S2.

More specifically, the switchable LC resonator 101 includes an inductive unit constructed by a first inductor L1 and a first capacitor C1; a first capacitive unit constructed by a second capacitor C2; and a second capacitive unit constructed by a third capacitor C3, a diode D1, a fourth capacitor C4, and a resistor R1. As to the inductive unit, the first inductor L1 has a terminal coupled to an external DC voltage source VDC and another terminal coupled to both of the input node A and the output node B. Moreover, the first capacitive C1 has a terminal coupled to the external DC voltage source $V_{DC}$ and another terminal coupled to ground. As to the first capacitive unit, the second capacitor C2 has a terminal coupled to both of the input node A and the output node B, and another terminal coupled to ground. As to the second capacitive unit, the third capacitor C3 has a terminal coupled to both of the input node A and the output node B, and another terminal coupled to a P electrode of the diode D1. The fourth capacitor C4 is coupled in series between an N electrode of the diode D1 and ground. The resistor R1 is also coupled in series between the N electrode of the diode D1 and ground.

More specifically, the switch signal input interface circuit 102 includes a second inductor L2 and a fifth capacitor C5. The second inductor L2 has a terminal coupled to the P electrode of the diode D1 and another terminal for receiving the switch signal SW. The fifth capacitor C5 has a terminal coupled to the terminal, used for receiving the switch signal SW, of the second inductor L2, and another terminal coupled to ground. In the present invention, the switch signal SW is designed as a DC voltage signal having two states, which are a predetermined lower voltage level and a predetermined higher voltage level. In addition, the switch signal SW having the predetermined lower voltage level cannot turn on the diode D1 whereas the switch signal SW having the predetermined higher voltage level can turn on the diode D1. In terms of the DC voltage signal, the second inductor L2 performs like a short circuit whereas the fifth capacitor C5 performs like an open circuit. Therefore, the switch signal SW can be considered as directly coupling to the P electrode of the diode D1.

The operation of the switchable high frequency bandpass filter 100 according to the present invention will be described in detail with reference to FIG. 1 and FIGS. 2(a) and 2(b). Referring to FIG. 1 at first, when the switch signal SW input to the switchable LC resonator 101 through the switch signal input interface circuit 102 is at the predetermined lower voltage level, the diode D1 is turned off. As a result, the second capacitive unit constructed by the third capacitor C3, the diode D1, the fourth capacitor C4, and the resistor R1 in the switchable LC resonator 101 is disabled (like an open circuit). Consequently, the second capacitive unit has no contribution to the high frequency transfer function provided by the switchable LC resonator 101.

Figure 2A:
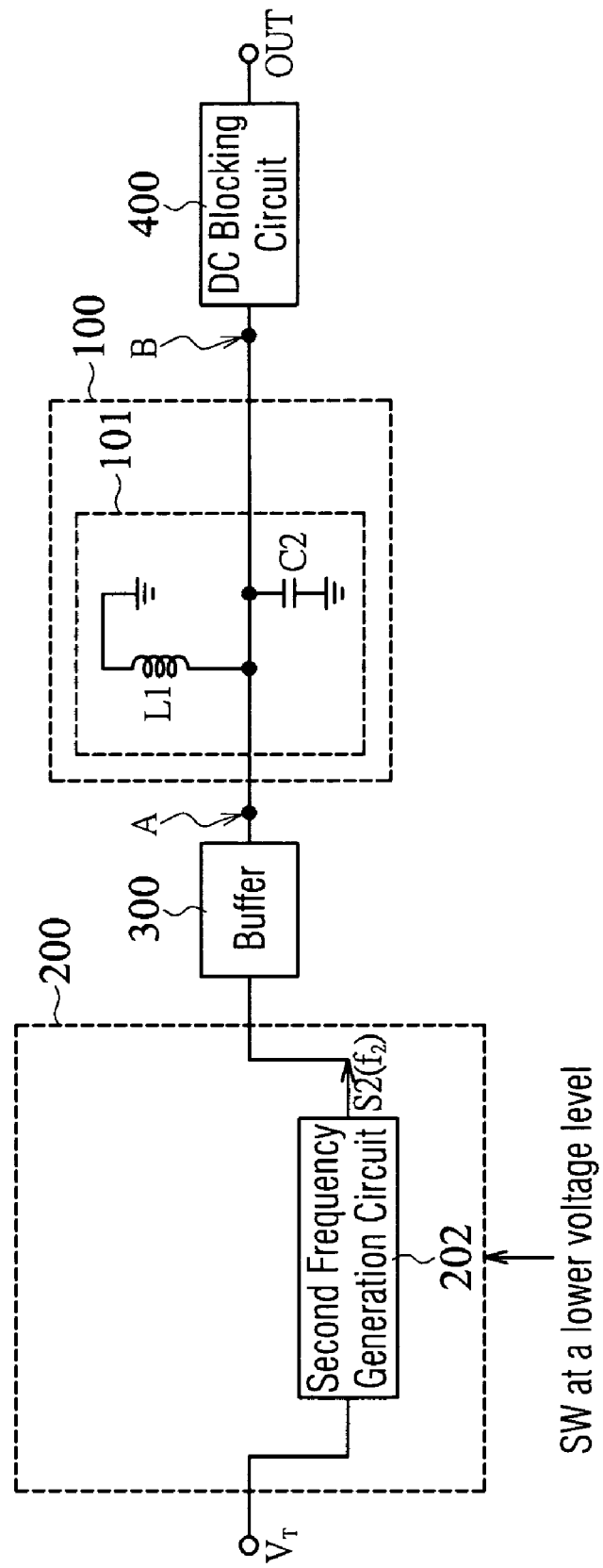
FIG. 2(a) is a schematic diagram showing a high frequency equivalent circuit of a switchable high frequency bandpass filter at a first state according to the present invention.

FIG. 2(a) is a schematic diagram showing a high frequency equivalent circuit of the switchable high frequency bandpass filter 100 when the switch signal SW is at the predetermined lower voltage level. Referring to FIG. 2(a), the high frequency signal generator 200 is configured in such a manner that only the second frequency generation circuit 202 is enabled when the switch signal SW is at the predetermined lower voltage level, thereby outputting the second high frequency signal S2 having the second frequency $f_2$. On the other hand, the first inductor L1 can be considered as coupled in series between the input node A and ground because the first capacitor C1 of the switchable LC resonator 101 is equivalent to a short circuit in the regime of high frequency. As a result, the switchable LC resonator 101 becomes a parallel LC resonant cirucit consisting of the first inductor L1 and the second capacitor C2.

Referring back to FIG. 1, when the switch signal SW input to the switchable LC resonator 101 through the switch signal input interface circuit 102 is at the predetermined higher voltage level, the diode D1 is turned on. As a result, the second capacitive unit constructed by the third capacitor C3, the diode D1, the fourth capacitor C4, and the resistor R1 in the switchable LC resonator 101 is enabled. Consequently, the second capacitive unit significantly contributes to the high frequency transfer function provided by the switchable LC resonator 101.

Figure 2B:
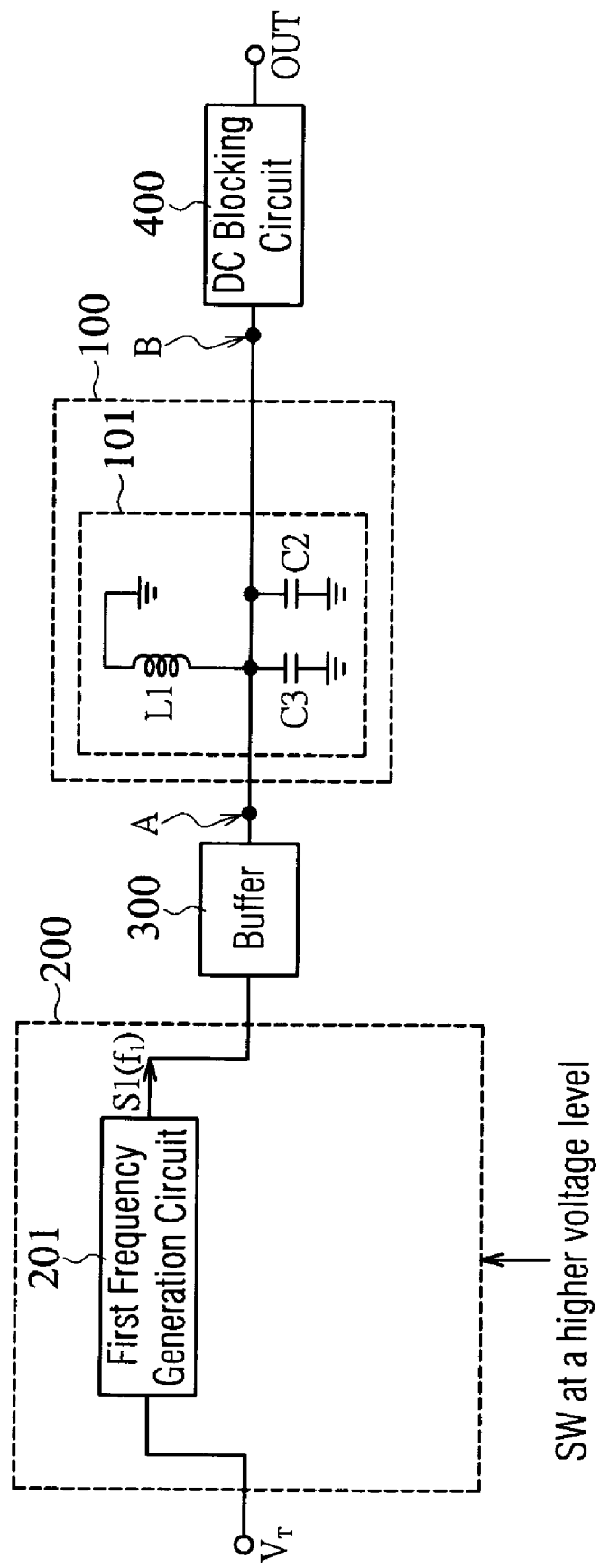
FIG. 2(b) is a schematic diagram showing a high frequency equivalent circuit of a switchable high frequency bandpass filter at a second state according to the present invention.

FIG. 2(b) is a schematic diagram showing a high frequency equivalent circuit of the switchable high frequency bandpass filter 100 when the switch signal SW is at the predetermined higher voltage level. Referring to FIG. 2(b), the high frequency signal generator 200 is configured in such a manner that only the first frequency generation circuit 201 is enabled when the switch signal SW is at the predetermined higher voltage level, thereby outputting the first high frequency signal S1 having the first frequency $f_1$. On the other hand, the first inductor L1 can be considered as being coupled in series between the input node A and ground because the first capacitor C1 of the switchable LC resonator 101 is equivalent to a short circuit in the regime of high frequency. Moreover, since the second capacitive unit constructed by the third capacitor C3, the diode D1, the fourth capacitor C4, and the resistor R1 in the switchable LC resonator 101 is enabled, the second capacitive unit must exhibit in the switchable LC resonator 101 shown in FIG. 2(b). It should be noted that in the second capacitive unit shown in FIG. 2(b), the diode D1, when turned on, can be considered as a short circuit, and the impedances of the resistor R1 and the fourth capacitor C4 are designed to be extremely larger than the impedance of the third capacitor C3 such that the fourth capacitor C4 can be considered as a short circuit in the regime of high frequency. As a result, the switchable LC resonator 101 becomes a parallel LC resonant circuit consisting of the first inductor L1, the second capacitor C2, and the third capacitor C3.

Figure 3A:
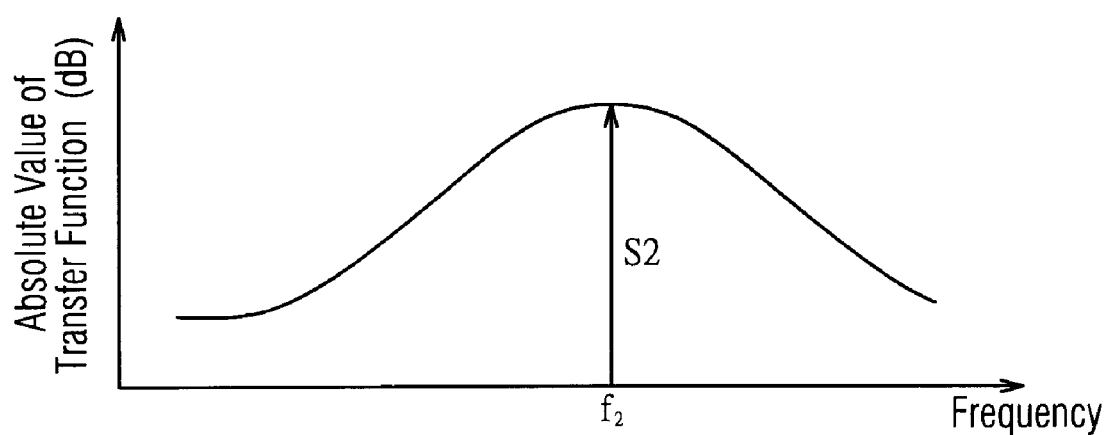
FIG. 3(a) is a graph showing a filter transfer function provided by a switchable high frequency bandpass filter at a first state according to the present invention.
Figure 3B:
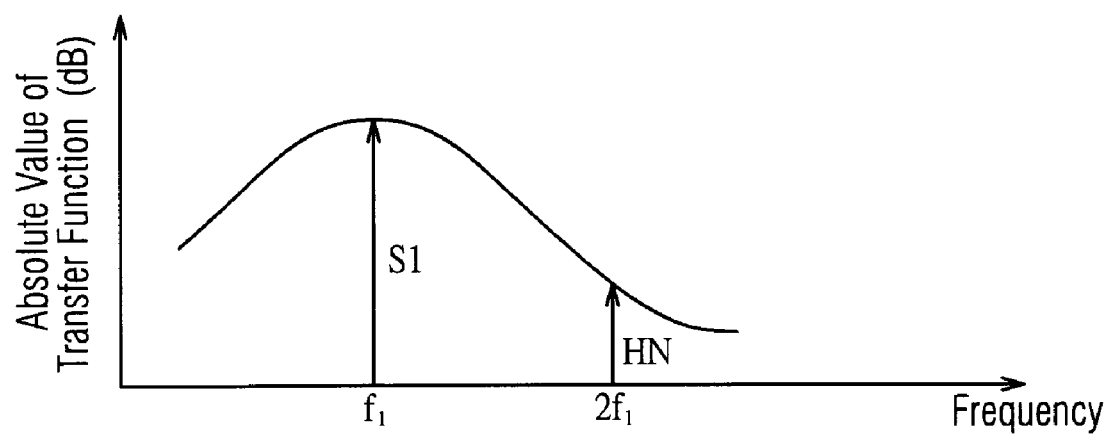
FIG. 3(b) is a graph showing a filter transfer function provided by a switchable high frequency bandpass filter at a second state according to the present invention.

FIGS. 3(a) and 3(b) show filter transfer functions provided by the switchable high frequency bandpass filter 100 according to the present invention. FIG. 3(a) is a graph showing a filter transfer function provided during the switch signal SW is at the predetermined lower voltage level. FIG. 3(b) is a graph showing another filter transfer function provided during the switch signal SW is at the predetermined higher voltage level.

Referring to FIG. 3(a), the second frequency generation circuit 202 outputs the second high frequency signal S2 having the second frequency $f_2$ when the switch signal SW is at the predetermined lower voltage level. In this case, the switchable LC resonator 101 is a parallel LC resonant circuit consisting of the first inductor L1 and the second capacitor C2. From FIG. 3(a), it is known that the switchable LC resonator 101 provides a filter transfer function suitable for the second high frequency signal S2 having the second frequency $f_2$ so as to perform the desired bandpass function with respect to the second high frequency signal S2.

Referring to 3(b), the first frequency generation circuit 201 outputs the first high frequency signal S1 having the first frequency $f_1$ when the switch signal SW is at the predetermined higher voltage level. In this case, the switchable LC resonator 101 is a parallel LC resonant circuit consisting of the first inductor L1, the second capacitor C2, and the third capacitor C3. The filter transfer function of the switchable LC resonator 101 is shifted toward the left of the graph due to the presence of the third capacitor C3, thereby effectively performing the desired bandpass function with respect to the first high frequency signal S1 having a lower frequency. In addition, it is clearly known from FIG. 3(b) that the switchable LC resonator 101 effectively prevents the second harmonic noise HN having a frequency of $2f_1$ from passing. Therefore, reduction of interference caused by the second harmonic noise HN is advantageously obtained.

To sum up, the switchable high frequency bandpass filter according to the present invention provides two different filter transfer functions for two different frequency signals so as to enhance the frequency selecting ability, thereby reducing the interference between the signals. Moreover, the switchable high frequency bandpass filter according to the present invention provides two different filter transfer functions for two different frequency signals so as to minimize the number of the necessary component circuits, thereby achieving the reduction of size and product cost.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A switchable high frequency bandpass filter comprising:
   an input node and an output node;
   a switchable LC resonator coupled between the input node and the output node for providing a plurality of switchable filter transfer functions for a plurality of high frequency signals having different frequencies transmitted from the input node to the output node, and the switchable filter transfer functions are used for performing bandpass functions with respect to the high frequency signals, wherein the switchable LC resonator comprises:
   an inductive unit coupled between the input node and ground;
   a first capacitive unit coupled between the input node and ground such that the inductive unit and the first capacitive unit construct a first-state parallel LC resonant circuit; and
   a second capacitive unit coupled between the input node and ground such that the inductive unit, the first capacitive unit, and the second capacitive unit construct a second-state parallel LC resonant circuit; and
   a switch signal input interface circuit coupled to the switchable LC resonator,
   wherein a switch signal is applied to the switchable LC resonator through the switch signal input interface circuit for controlling the switchable LC resonator to provide the plurality of high frequency signals having different frequencies with a suitable one of the plurality of switchable filter transfer functions.

2. The switchable high frequency bandpass filter according to claim 1, wherein the switch signal is a DC voltage signal having a predetermined lower voltage level and a predetermined higher voltage level, and the second capacitive unit is enabled when the switch signal is at the predetermined lower voltage level, and the second capacitive unit is disabled when the switch signal is at the predetermined higher voltage level, resulting in that the switchable LC resonator switches in configuration between the first-state parallel LC resonant circuit and the second-state parallel LC resonant circuit.

3. The switchable high frequency bandpass filter according to claim 2, further comprising:
a DC blocking circuit for blocking a DC signal, having a first terminal coupled to the output node and a second terminal used as a common high frequency output terminal.

4. The switchable high frequency bandpass filter according to claim 3, wherein the DC blocking circuit is constructed by a capacitive element having a terminal used as the first terminal and another terminal used as the second terminal.

5. The switchable high frequency bandpass filter according to claim 2, further comprising:
a high frequency signal generator coupled to the input node for generating the plurality of high frequency signals having different frequencies and controlled by the switch signal such that only one of the plurality of high frequency signals is input into the input node at any time.

6. The switchable high frequency bandpass filter according to claim 5, further comprising:
a buffer coupled between the high frequency signal generator and the input node.

7. The switchable high frequency bandpass filter according to claim 5, wherein the high frequency signal generator comprises:
a first frequency generation circuit coupled between a tuning voltage and the input node for generating a first high frequency signal having a first frequency, and
a second frequency generation circuit coupled between the tuning voltage and the input node for generating a second high frequency signal having a second frequency,
wherein the second frequency is larger than the first frequency, and the second frequency generation circuit is enabled when the switch signal is at the predetermined lower voltage level, thereby allowing the second high frequency signal to be input into the input node, and the first frequency generation circuit is enabled when the switch signal is at the predetermined higher voltage level, thereby allowing the first high frequency signal to be input into the input node.

8. The switchable high frequency bandpass filter according to claim 7, wherein the second frequency of the second high frequency signal is substantially twice as high as the first frequency of the first high frequency signal.

9. The switchable high frequency bandpass filter according to claim 7, wherein each of the first frequency generation circuit and the second frequency generation circuit is formed by a voltage control oscillator.

10. The switchable high frequency bandpass filter according to claim 1, wherein the inductive unit comprises:
a first inductor having a terminal coupled to an external DC voltage source and another terminal coupled to both of the input node and the output node, and
a first capacitor having a terminal coupled to the external DC voltage source and another terminal coupled to ground.

11. The switchable high frequency bandpass filter according to claim 1, wherein the first capacitive unit comprises:
a second capacitor having a terminal coupled to both of the input node and the output node, and another terminal coupled to ground.

12. The switchable high frequency bandpass filter according to claim 1, wherein the second capacitive unit comprises:
a third capacitor having a terminal coupled to both of the input node and the output node;
a diode having a P electrode for receiving the switch signal and an N electrode, the P electrode being coupled to another terminal of the third capacitor and the switch signal input interface;
a fourth capacitor coupled in series between the N electrode of the diode and ground; and
a resistor coupled in series between the N electrode of the diode and ground.

13. The switchable high frequency bandpass filter according to claim 12, wherein the switch signal is a DC voltage signal having a predetermined lower voltage level and a predetermined higher voltage level, and the switch signal cannot turn on the diode when the switch signal is at the predetermined lower voltage level, and the switch signal can turn on the diode when the switch signal is at the predetermined higher voltage level.

14. The switchable high frequency bandpass filter according to claim 12, wherein the switch signal input interface circuit comprises:
a second capacitor having a terminal coupled to the P electrode of the diode and another terminal for receiving the switch signal, and
a fifth capacitor having a terminal coupled to the another terminal, for receiving the switch signal, of the second capacitor and another terminal coupled to ground.

15. A switchable high frequency bandpass filter comprising:
a high frequency signal generator controlled by a switch signal, and having a first frequency generation circuit and a second frequency generation circuit; a buffer electrically connected to the high frequency signal generator; a switchable LC resonator electrically connected to the buffer; and a switch signal input interface circuit electrically connected to the switchable LC resonator and receiving the switch signal, wherein when the switch signal is at a predetermined higher voltage level, the first frequency generation circuit is enabled to generate a first signal; when the switch signal is at the predetermined lower voltage level, the second frequency generation circuit is enabled to generate a second signal having a frequency twice that of the first signal; and wherein the switchable LC resonator comprises, an inductive unit coupled between an input node and ground; a first capacitive unit coupled between the input node and ground such that the inductive unit and the first capacitive unit construct a first-state parallel LC resonant circuit; and a second capacitive unit coupled between the input node and around such that the inductive unit, the first capacitive unit, and the second capacitive unit construct a second-state parallel LC resonant circuit.

16. The switchable high frequency bandpass filter according to claim 15, further comprising:
a DC blocking circuit for blocking a DC signal, having a first terminal coupled to an output node and a second terminal used as a common high frequency output terminal.

17. The switchable high frequency bandpass filter according to claim 15, wherein the inductive unit comprises: a first induct or having a terminal coupled to an external DC voltage source and another terminal coupled to both of the input node and an output node; and a first capacitor having a terminal coupled to the external DC voltage source and another terminal coupled to ground; the first capacitive unit comprises: a second capacitor having a terminal coupled to both of the input node and the output node, and another terminal coupled to ground; and the second capacitive unit comprises: a third capacitor having a terminal coupled to both of the input node and the output node; a diode having a P electrode for receiving the switch signal and an N electrode, the P electrode being coupled to another terminal of the third capacitor and the switch signal input interface; a fourth capacitor coupled in series between the N electrode of the diode and ground; and a resistor coupled in series between the N electrode of the diode and ground.

18. The switchable high frequency bandpass filter according to claim 17, wherein the switch signal input interface circuit comprises:

a second capacitor having a terminal coupled to the P electrode of the diode and another terminal for receiving the switch signal, and a fifth capacitor having a terminal coupled to the another terminal, for receiving the switch signal, of the second capacitor and another terminal coupled to ground.

* * * * *